United States Patent [19]

Ogle et al.

[11] Patent Number: 4,871,421

[45] Date of Patent: Oct. 3, 1989

[54] SPLIT-PHASE DRIVER FOR PLASMA ETCH SYSTEM

[75] Inventors: John Ogle, Milpitas; Gerald Z. Yin, San Jose, both of Calif.

[73] Assignee: Lam Research Corporation, Fremont, Calif.

[21] Appl. No.: 245,082

[22] Filed: Sep. 15, 1988

[51] Int. Cl.[4] ............... H01L 21/306; B44C 1/22; C03C 15/00; C03C 25/06

[52] U.S. Cl. .................... 156/643; 156/646; 156/345; 204/192.32; 204/298

[58] Field of Search ........... 156/643, 646, 657, 659.1, 156/662, 345; 204/192.32, 192.35, 192.37, 298; 427/38, 39; 118/728, 50.1, 620

[56] References Cited

U.S. PATENT DOCUMENTS

| | | | |
|---|---|---|---|
| 4,134,817 | 1/1978 | Bourdon | 204/192 |
| 4,253,907 | 3/1981 | Parry et al. | 156/643 |
| 4,399,016 | 8/1983 | Tsukada et al. | 204/192 |
| 4,626,312 | 12/1986 | Tracy | 156/345 |
| 4,711,767 | 12/1987 | Diederich | 156/345 X |
| 4,724,296 | 2/1988 | Morley | 156/345 X |

Primary Examiner—William A. Powell
Attorney, Agent, or Firm—Townsend & Townsend

[57] ABSTRACT

A plasma etching system includes a radio frequency generator and a parallel plate plasma reactor vessel. A phase inverter circuit is used to couple the RF generator to the electrodes in the plasma reactor so that the electrodes are driven with voltages of substantially equal magnitude but which are 180° out-of-phase. In this way, a maximum potential difference between the electrodes can be achieved while minimizing the potential difference between the individual electrodes and the reactor vessel. Such operation allows higher power levels with reduced occurrence of arcing and stray discharge, and provides a stable, uniform plasma discharge.

9 Claims, 1 Drawing Sheet

U.S. Patent   Oct. 3, 1989   4,871,421
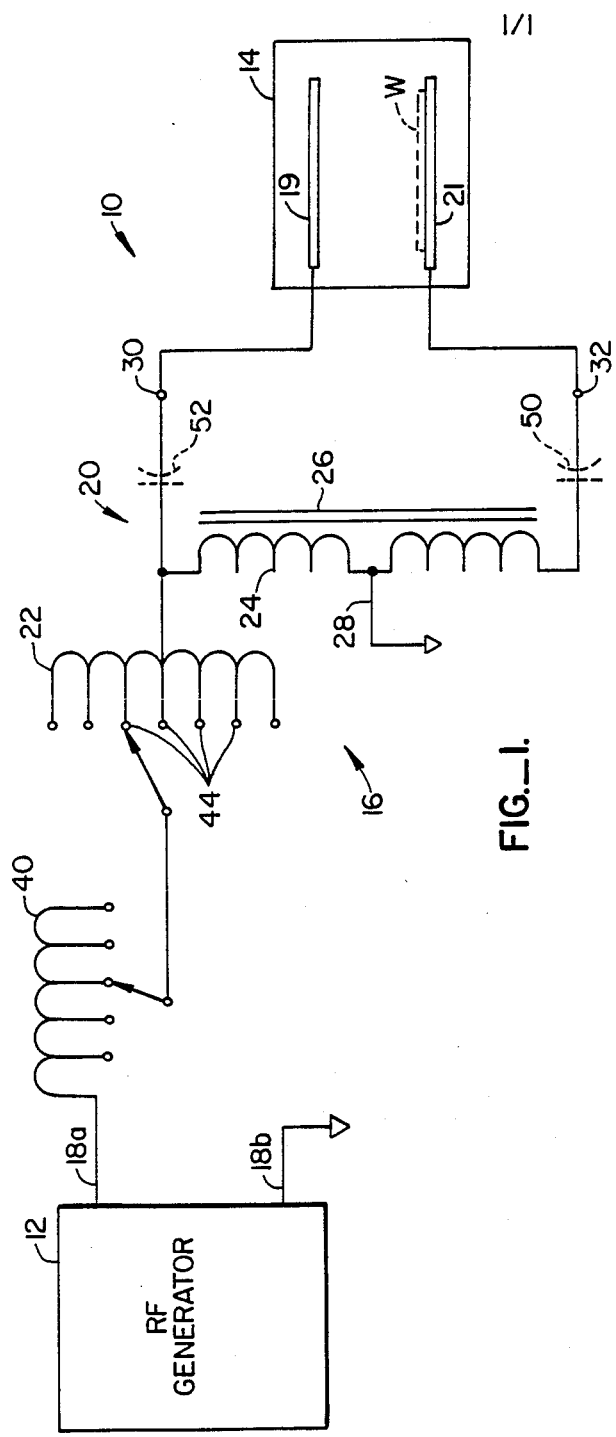
FIG._1.
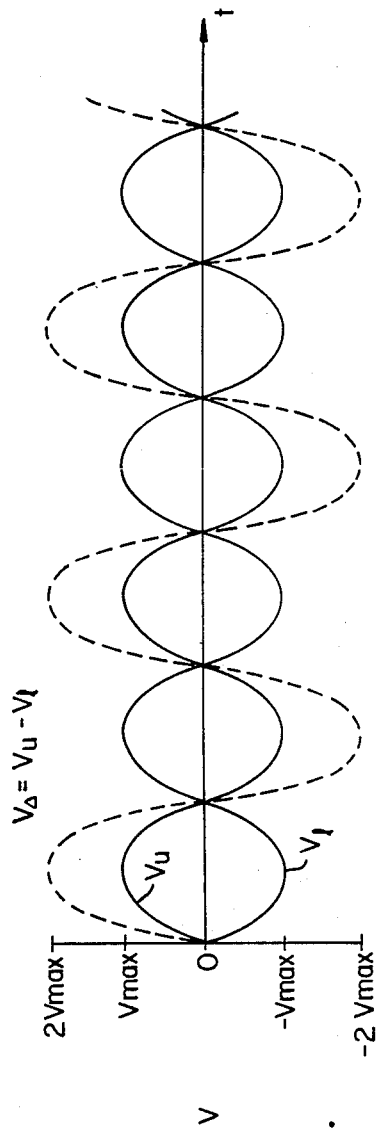
FIG._2.

SPLIT-PHASE DRIVER FOR PLASMA ETCH SYSTEM

BACKGROUND OF THE INVENTION

1. Field of the Invention

The present invention relates generally to the construction and operation of plasma etching systems, and more particularly to methods and apparatus for powering single wafer plasma etch systems including a pair of parallel, opposed electrodes.

Single wafer, parallel plate plasma etching systems comprise a lower electrode, generally referred to as a chuck electrode, and an opposed upper electrode, generally referred to as a counter electrode. Either electrode may be powered by a radio frequency signal while the other electrode is grounded to induce the plasma necessary to accomplish the etching.

In order to enhance the etch rate afforded by a plasma etching system, it is desirable to induce a high voltage across the electrodes, imparting very high energy levels to the system. The voltage which can be applied, however, is limited by the occurrence of stray discharges and arcing between the driven electrode and the grounded reactor housing. Such discharges dissipate RF power, can damage the equipment, and most importantly cause discontinuities and instabilities in the plasma which can cause non-uniformity in the etch rate across the wafer.

It would therefore be desirable to provide apparatus and methods for performing plasma etching at relatively high voltage and power levels without the occurrence of arcing and stray discharges as have just been described.

2. Description of the Background Art

U.S. Pat. No. 4,626,312 to Tracy proposes that stray electrical discharges in parallel plate plasma reactors can be reduced by dividing the applied voltage between the upper and lower electrodes. Two specific systems for achieving such voltage division are described. The first system is utilized in low frequency reactors (400 kHz) and employs an ungrounded RF generator to feed the electrodes in a grounded reactor chamber. It is apparently assumed that the voltage applied across the electrodes will float approximately equally about the ground potential of the reactor vessel, thus minimizing the potential difference between either electrode and ground. While generally achievable, the desired equal division of the voltage between the electrodes cannot be fully realized because of asymmetries in the construction of the reactor vessel, electrodes, and electrical feed lines, as well as the unbalanced impedance load placed on the counter electrode by the wafer. Thus, a precise division of the applied voltage cannot be effected and the theoretical maximum voltage cannot be utilized.

The second system is intended primarily for high frequency (13 MHz) plasma etch reactors, and includes a grounded RF generator connected across the opposed electrodes with a variable inductor between the chuck electrode and ground. The inductor causes a phase shift in the voltage on the chuck electrode which, together with the phase shift resulting from the capacitive nature of the electrodes themselves, results in a phase shift between the voltages on the two electrodes which approaches 180°. As can be seen in FIG. 3 of the patent, however, the phase shift will not reach 180° so that the maximum potential difference across the plasma without arcing cannot be achieved.

See also, U.S. Pat. Nos. 4,399,016; 4,253,907; and 4,134,817, which disclose alternate systems for powering parallel plate plasma reactors.

For these reasons, it would be desirable to provide a system and method for dividing voltage between the upper and lower electrodes in a plasma etch system in a highly controlled manner to maximize the potential difference between the electrodes which can be employed to induce a plasma without causing stray discharges between either of the electrodes and the reactor chamber.

SUMMARY OF THE INVENTION

The present invention provides apparatus and methods for the etching of semiconductor wafers in parallel plate plasma reactors where a desired potential difference between the electrodes of the reactor is achieved by applying two voltages of substantially equal magnitude but precisely 180° out-of-phase to the upper and lower electrodes, respectively. The reactor chamber is grounded, and the voltages applied to the electrodes are fixed relative to ground so that the maximum potential created between either electrode and the reactor vessel can be minimized, while simultaneously maximizing the potential difference between the two electrodes. In this way, maximum etching power can be provided while reducing or eliminating arcing and stray discharges which would otherwise occur in the reactor vessel Moreover, the even division of power between the two electrodes provides a well focused, stable plasma therebetween.

In the preferred embodiment, a plasma etching system employs a conventional radio frequency (RF) generator and a plasma reactor chamber having parallel upper and lower electrodes. Output of the RF generator is transformed by a phase inverter circuit employing a transformer with a center-tapped secondary. The primary winding of the transformer is coupled to the RF generator and first and second terminals of the secondary winding are connected to the upper and lower electrodes, respectively. Such circuitry assures that the wave forms applied to the electrode will be substantially equal, but 180° out-of-phase. Impedance matching elements will be provided in the circuitry to maximize power transfer, and a variable inductor will be provided to allow phase tuning.

BRIEF DESCRIPTION OF THE DRAWINGS

FIG. 1 is a schematic diagram illustrating preferred circuitry of the present invention.

FIG. 2 is a graph illustrating the potential on the upper electrode ($V_u$), the potential on the lower electrode ($V_l$), as well as the net potential difference between the two electrodes ($V_\Delta$).

DESCRIPTION OF THE SPECIFIC EMBODIMENTS

Referring to FIG. 1, a plasma etching system 10 constructed in accordance with the principles of the present invention includes a radio frequency (RF) generator 12 whose output is coupled to a single wafer, parallel plate plasma reactor 14 by intermediate phase inversion circuitry 16, as described in more detail hereinbelow.

The RF generator 12 may be of a type which is generally recognized by those skilled in the art as being suitable for driving conventional plasma etching reactors.

The RF generator will usually operate a low RF frequencies (about 400 kHz) with a low impedance output (usually about 50 ohms). The generator 12 will be capable of producing from about 1 to 10 amps, usually from about 1 to 5 amps, at an RMS voltage of at least about 100 volts, usually being at least about 200 volts, or more. Conveniently, output lines 18 will be in the form of a coaxial cable, with 18b being the grounded shield portion of the cable.

Plasma reactor 14 is also of conventional construction and includes an upper or counter electrode 19 and a lower or chuck electrode 20. A semiconductor wafer W is generally placed on the lower electrode 20, a suitable etchant gas introduced at very low pressures, and radio frequency power applied to the electrodes 19 and 20 to induce the desired plasma for etching. The construction and operation of plasma etching reactors suitable for use in the present invention are described in U.S. Pat. No. 4,433,951, the disclosure of which is incorporated herein by reference.

The construction of plasma etch reactor 14 will be non-conventional in one respect. Both the electrodes 19 and 21 are electrically isolated from the remaining portions of the reactor vessel, while the walls of the reactor vessel will be grounded or maintained at a fixed reference voltage. Heretofore, most plasma reactors have employed one grounded electrode with voltage applied to the opposite electrode.

The phase inversion circuitry 16 of the present invention generally comprises a transformer 20 having a primary coil 22, a secondary coil 24, and a ferrite core 26. The secondary coil 24 will have a grounded center tap 28, with a first terminal 30 connected to the upper electrode 19 and a second terminal 32 connected to the lower electrode 21. The output of the RF generator 12 will be coupled to the primary coil 22 (as described in more detail hereinbelow), resulting in voltage signals having substantially equal magnitude, but which are 180° out-of-phase, being applied to the upper and lower electrodes 19 and 21. The frequency applied to each of the electrodes will, of course, be the same as that supplied by the RF generator 12, typically 400 kHz, and the magnitude will depend on both the output voltage of the RF generator and the ratio of primary to secondary windings in the transformer. Usually, the transformer 20 will have a step-up ratio in the range from 2 to 8, usually being about 4. Thus, the peak voltage applied to each electrode will generally be in the range from about 50 to 400 V (RMS), usually being in the range from about 75 to 300 V (RMS).

Referring now to FIG. 2, it can be seen that the voltage on the upper electrode 19 ($V_u$) and the voltage on the lower electrode 21 ($V_1$) have identical magnitudes, but are 180° out-of-phase. The maximum voltage on each of the electrodes 19 and 21 will have an absolute value of $V_{max}$, so that the potential difference between the electrodes will have an absolute value of $2V_{max}$. ($V_\Delta = V_u - V_1$). In this way, the potential difference between the electrodes can be maximized, with the maximum potential difference between either electrode and the reactor vessel being only one-half the potential difference between the electrodes.

In order to tune the phase component of the RF signal fed to the plasma reactor 14, an inductor 40 is connected in series with the output 18a of the RF generator 12. The inductor 40 will typically have an inductance in the range from about 10 µH to about 100 µH, with the inductance being selectable on the basis of multiple taps 42. Tuning can be accomplished with either a manually-actuated switch or an automated closed loop control system.

The primary coil 22 of the transformer 20 will also include multiple taps 44. The selection of the tap 44 allows impedance adjustment in the range from about 100 to 300 ohms in order to allow proper impedance matching, to maximize power transfer between the RF generator 12 and he reactor vessel 14. Changing the tap 44 will, of course, also affect the step-up ratio of the transformer 20.

The inclusion of both phase adjustment and impedance matching are both well known in the art and need not be described further Both adjustments may be either manual or employ an automated closed loop control system.

Optionally, a DC bias may be introduced onto the electrodes 19 and 21 by including capacitors 50 an 52 in the output lines of the transformer 20. Again, the inclusion of such DC biasing means is well known in the art and need not be described further.

Although the foregoing invention has been described in some detail by way of illustration and example for purposes of clarity of understanding, it will be obvious that certain changes and modifications may be practiced within the scope of the appended claims.

What is claimed is:

1. A plasma etching system comprising:
    a plasma reactor including an electrically-isolated upper electrode and an electrically-isolated lower electrode in a grounded chamber;
    a grounded generator producing a radio frequency input voltage;
    means for dividing the input voltage into a first output voltage and a second output voltage, said first and second output voltages having substantially equal magnitudes relative to ground, but being 180° out of phase; and
    means for coupling the first output voltage to the upper electrode and the second output voltage to the lower electrode.

2. A plasma etching system as in claim 1, wherein the generator produces a radio frequency of about 400 kHz.

3. A plasma etching system as in claim 1, wherein the means for dividing the input voltage is a transformer having a primary winding and a center-tapped secondary winding, wherein the primary winding is coupled to the radio frequency generator and the terminals of the secondary winding are coupled to the electrodes with the center tap connected to ground.

4. A plasma etching system as in claim 3, further including means for matching the impedance of the plasma to the radio frequency generator.

5. A plasma etching system as in claim 4, wherein the impedance matching means comprises a variable inductor connected in series with the output of the radio frequency generator.

6. A plasma etching system as in claim 5, wherein the impedance matching means further comprises a variable primary winding on the balanced-to-unbalanced transformer.

7. A method for plasma etching semiconductor wafers, said method comprising:
    placing a wafer on a first planar electrode in a reactor vessel at a fixed dc reference voltage;
    driving said first electrode and a second, opposed planar electrode with radio frequency voltages having substantially identical magnitudes but which are 180° out-of-phase; and wherein said drive voltages are fixed relative to said reference voltage.

8. A method as in claim 7, wherein the voltage applied to the electrodes has a peak value in the range from about 50 to 400 volts (RMS).

9. A method as in claim 7, wherein the radio frequency voltage is about 400 kHz.

* * * * *

UNITED STATES PATENT AND TRADEMARK OFFICE
CERTIFICATE OF CORRECTION

PATENT NO. : 4,871,421
DATED : October 3, 1989
INVENTOR(S) : Ogle et al.

It is certified that error appears in the above—identified patent and that said Letters Patent is hereby corrected as shown below:

Column 3, line 12, please cancel "20" and substitute therefor --21--;

Column 3, line 13, please cancel "20" and substitute therefor --21--;

Column 3, line 16, please cancel "20" and substitute therefor --21--;

Column 3, line 46, after "have" please cancel "a" and substitute therefor --an impedance--.

Signed and Sealed this

Twenty-seventh Day of November, 1990

Attest:

HARRY F. MANBECK, JR.

Attesting Officer

Commissioner of Patents and Trademarks